(12) United States Patent
Shakiba et al.

(10) Patent No.: US 6,201,450 B1
(45) Date of Patent: Mar. 13, 2001

(54) EXTENDED FREQUENCY RANGE RELAXATION OSCILLATOR WITH IMPROVED LINEARITY

(75) Inventors: Mohammad Hossein Shakiba, Toronto (CA); Tirdad Sowlati Hashjani, Ossining, NY (US)

(73) Assignee: Gennum Corporation, Burlington (CA)

( * ) Notice: Subject to any disclaimer, the term of this patent is extended or adjusted under 35 U.S.C. 154(b) by 0 days.

(21) Appl. No.: 09/381,291

(22) PCT Filed: Apr. 1, 1998

(86) PCT No.: PCT/CA98/00294

§ 371 Date: Sep. 22, 1999

§ 102(e) Date: Sep. 22, 1999

(87) PCT Pub. No.: WO98/45944

PCT Pub. Date: Oct. 15, 1998

(30) Foreign Application Priority Data

Apr. 3, 1997 (CA) .................................................. 2201697

(51) Int. Cl.[7] .............................................. H03K 3/0231
(52) U.S. Cl. ................... 331/111; 331/113 R; 331/177 R
(58) Field of Search ............................... 331/111, 113 R, 331/143, 144, 177 R

(56) References Cited

U.S. PATENT DOCUMENTS

| 3,296,556 | * | 1/1967 | Schaefer | 331/111 |
| 4,977,381 | * | 12/1990 | Main | 331/111 |
| 5,489,878 | * | 2/1996 | Gilbert | 331/57 |

FOREIGN PATENT DOCUMENTS

0 180 084 A2  *  5/1986 (EP) .
0 753 934 A1  *  1/1997 (EP) .

* cited by examiner

*Primary Examiner*—Siegfried H. Grimm
(74) *Attorney, Agent, or Firm*—Bereskin & Parr

(57) ABSTRACT

A relaxation oscillator, such as a voltage controlled oscillator (VCO), with automatic swing control feedback which dynamically monitors the voltage swing across a capacitor and adjusts the oscillator threshold voltage, at which reversal of the polarity of the charging/discharging current occurs, to maintain the effective voltage swing at a constant level. The improved relaxation oscillator provides a very wide linear range of frequency variation versus control voltage (or current) and allows for the extendibility of linear operation to or near the maximum frequency that can be practically achieved by the oscillator circuitry.

22 Claims, 5 Drawing Sheets

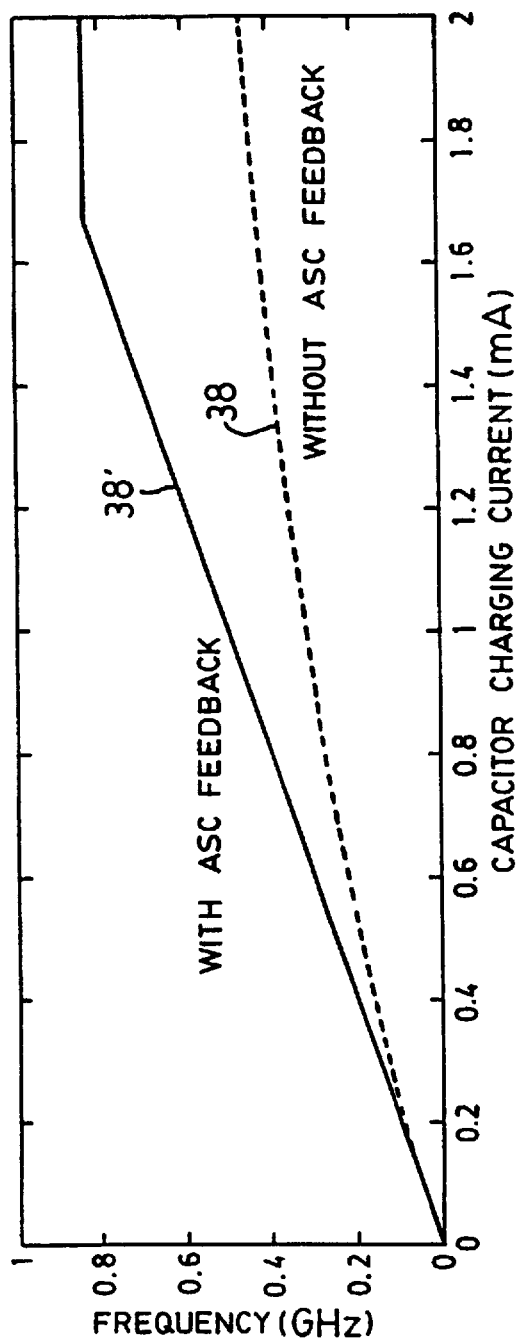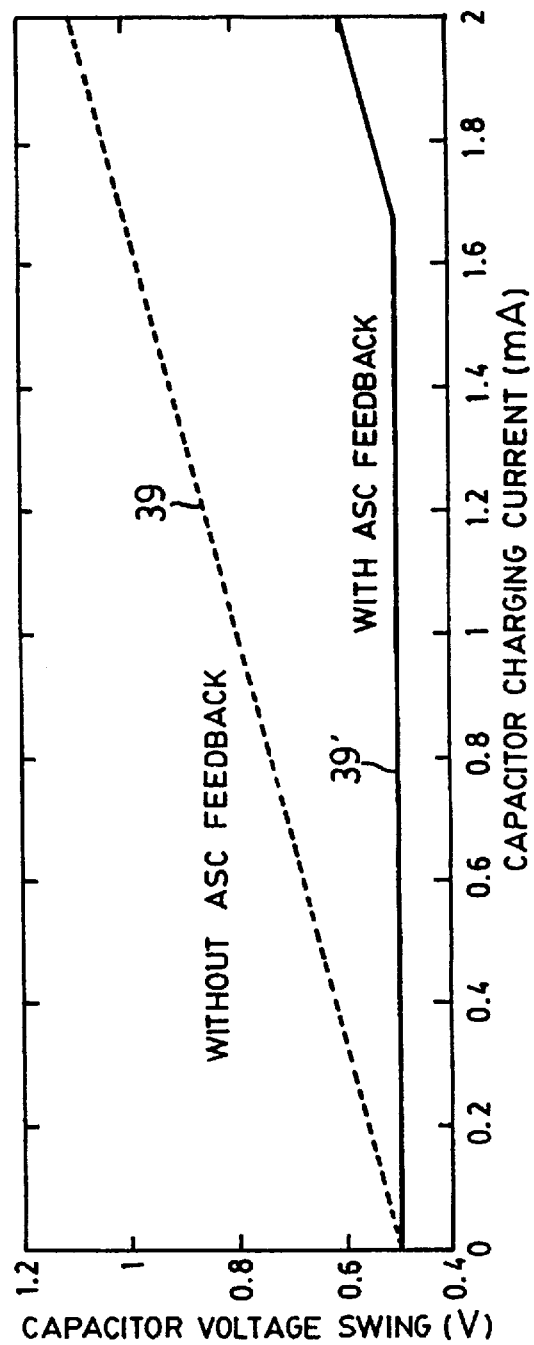

EXTENDED FREQUENCY RANGE RELAXATION OSCILLATOR WITH IMPROVED LINEARITY

FIELD OF THE INVENTION

The present invention relates to the fields of analog and digital communication, data communication, clock recovery, phase locked loops, voltage controlled oscillators (VCOs), multivibrators, relaxation oscillators, and monolithic oscillators. Specifically the present invention is a relaxation oscillator with an extended linear voltage/current to frequency characteristic which is suitable for use in high speed clock recovery systems and which has a wide frequency acquisition range.

BACKGROUND OF THE INVENTION

A relaxation oscillator, such as a relaxation voltage/current controlled oscillator, is an oscillator circuit which has its frequency of oscillation determined by the time to charge and/or discharge a capacitor (or other reactive element) to a threshold level.

In U.S. Pat. No. 4,977,381, Main discloses a relaxation oscillator in which a capacitor is placed in a differential configuration between a first and a second current supply means. The direction in which the capacitor is charged or discharged is controlled by a differential pair of transistor switches which are turned on and off by a bistable circuit element such as a latch. A control signal which gates the bistable element is inverted when the voltage across the capacitor is at opposite polarities of a particular threshold. The bistable element eliminates sudden voltage jumps at switching times and thereby avoids saturation of the collector-emitter conduction paths of the transistor switches when they are suddenly turned on. A circuit responsive to the dynamic terminal voltages of the capacitor controls either the first current supply means or the second current supply means to maintain the DC (direct current) voltage of the capacitor terminals at a constant, predetermined value. As a result, the slew rate of the voltages at the terminals of the charging capacitor remains substantially constant for a given frequency of operation.

While the relaxation oscillator disclosed by Main desensitizes the oscillator to the effects of the inherent stray capacitance and improves the accuracy of the output frequency, it is susceptible to certain drawbacks. Generally, in relaxation oscillator circuitry the charging current through the capacitor must be reversed once the capacitor voltage reaches a threshold value. However, there is a delay associated with this toggling. During this delay, the capacitor continues to charge, and its voltage exceeds the threshold level during the period until the direction of current is effectively switched. As a result, the frequency of oscillation is also reduced.

As the frequency of oscillation increases, this delay becomes more and more problematic and causes the frequency to cease to depend linearly on the charging current. A further consequence of this non-linearity is that the maximum frequency, and therefore the frequency range, for practical operation of the relaxation oscillator is reduced. Also, since the delay is dependent on temperature and process, the oscillator becomes overly sensitive to variations in these factors.

Yet another drawback of prior art relaxation oscillator circuits is that they require high quality complementary transistors.

It is therefore an object of the present invention in one aspect to provide an improved relaxation oscillator with an extended linear frequency range.

SUMMARY OF THE INVENTION

The present invention in one aspect provides an oscillator circuit, for generating an oscillating signal of a certain frequency, comprising: a capacitance coupled between a first terminal and a second terminal and adapted to have a voltage swing thereacross; a current supply circuit coupled to said capacitance for providing a current through said capacitance, the magnitude of said current being proportional to said frequency and the polarity of said current being reversible; a switching circuit coupled to said current supply circuit and responsive to one or more control signals, for controlling the polarity of said current through said capacitance; a DC shift providing circuit coupled to said capacitance for providing a DC shift value in response to the voltage at said first terminal, the voltage at said second terminal, and a predetermined value; and a control circuit coupled to said capacitance and said DC shift providing circuit for generating said one or more control signals in response to said voltage at said first terminal, said voltage at said second terminal, and said DC shift value so as to maintain the voltage swing across said capacitance substantially constant.

In another aspect the present invention provides a method for generating an oscillating signal of a certain frequency, said method comprising the steps of: (a) providing a current through a capacitance, said capacitance being coupled between a first terminal and a second terminal and said capacitor being adapted to have a voltage swing thereacross, the magnitude of said current being proportional to said frequency and the polarity of said current being reversible; (b) establishing the polarity of said current through said capacitance in response to one or more control signals; (c) generating a DC shift value in response to the voltage at said first terminal, the voltage at said second terminal, and a predetermined value; and (d) generating said one or more control signals in response to said voltage at said first terminal, said voltage at said second terminal, and said DC shift value so as to maintain the voltage swing across said capacitance substantially constant.

BRIEF DESCRIPTION OF THE DRAWINGS

In the accompanying drawings which illustrate a preferred embodiment of the invention:

FIG. 3A illustrates how the Automatic Swing Control (ASC) feedback of the present invention linearizes the current-frequency characteristic of the oscillator of FIG. 1.

FIG. 3B illustrates how the ASC feedback of the present invention maintains the capacitor voltage swing of the oscillator of FIG. 1 constant.

DETAILED DESCRIPTION OF THE INVENTION

Figure 1:
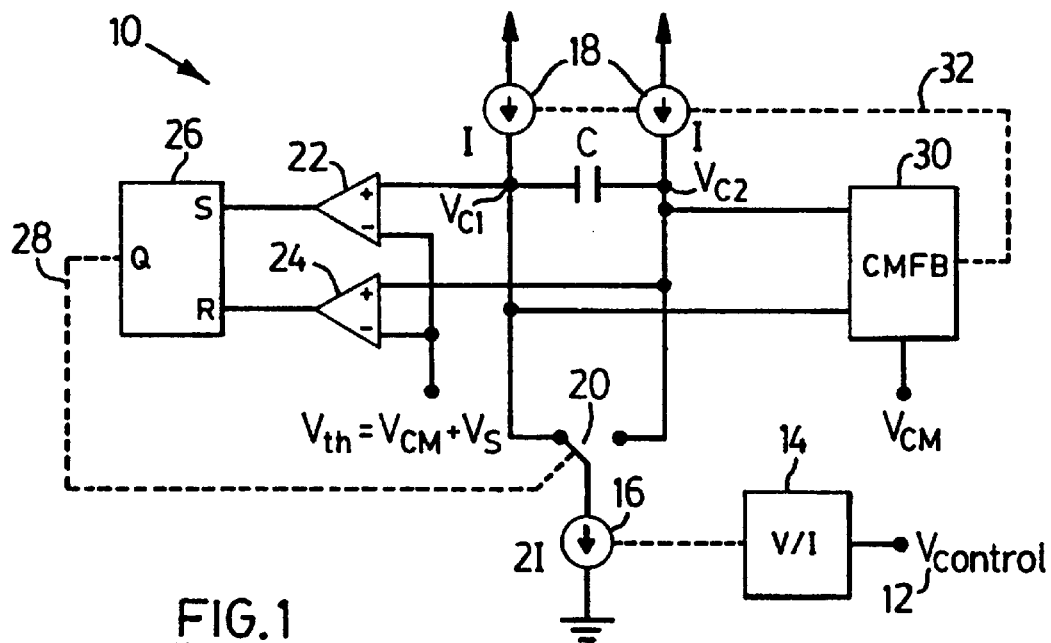
FIG. 1 is a typical differential relaxation oscillator according to the prior art.

FIG. 1 shows a typical prior art circuit for a differential relaxation oscillator 10. Note that oscillator 10 is a voltage controlled oscillator (VCO), whose frequency of operation is controlled by the $V_{control}$ signal 12 which is converted to a charging current supply 16 by voltage-to-current (V/I) converter 14.

The operation of oscillator 10 is based on alternately charging and discharging capacitor C between two threshold voltage levels. In a differential realization, the two opposite phases of the capacitor voltage can be alternately compared with one threshold voltage. Charging current supplies 16 and 18 provide a reference current I across the capacitor, the direction of which depends upon the configuration of switch 20. Switch 20 may comprise a pair of voltage or current controlled switches, such as a differential pair of transistors whose bases each receive a controlling bias voltage. As shown in FIG. 1, when the voltage at the first capacitor terminal $V_{C1}$ reaches the threshold voltage, as determined by comparator 22, a bistable circuit such as SR latch 26 has its output 28 set. When the voltage at the second capacitor terminal $V_{C2}$ reaches the threshold voltage, as determined by comparator 24, the output 28 is reset. The output 28 of SR latch 26 controls the state of switch 20 so that once the appropriate threshold is reached the polarity of the current through the capacitor is reversed. The capacitor swing voltage is the total variation in the amplitude of the capacitor voltage, and $V_S$ is denoted as the amplitude of the capacitor swing voltage (i.e. the capacitor voltage swing equals $2V_S$), A common-mode feedback (CMFB) circuit 30 maintains the average or common-mode value of voltages $V_{C1}$ and $V_{C2}$ equal to a constant predetermined reference value $V_{CM}$, i.e. $V_{CM}=(V_{C1}+V_{C2})/2$. This is accomplished by CMFB control signal 32 which keeps the value of charging current supply 18 equal to one-half the value of charging current supply 16. As a result, the voltage across the capacitor C swings between two levels: $2V_S$ and $-2V_S$, where $V_S=V_{th}-V_{CM}$. This is illustrated at 34 in FIG. 2 which shows the capacitor voltage waveform, which can be taken as the output of the oscillator circuit 10, with respect to a ground or zero reference voltage.

Assuming that the reference current through C is constant in the circuit of FIG. 1, the current can then be expressed as $$I = C \frac{V_s}{\frac{T}{8}} \tag{1}$$

(where T is the period of oscillation) so that the frequency of oscillation is given by $$f = \frac{I}{8CV_s} \tag{2}$$

which varies linearly with I. Practically, however, there is a delay, $T_d$ (see FIG. 2), between the time the capacitor voltage reaches the threshold level and the time the switch 20 changes state and reverses the direction of the current through capacitor C. During this time, the voltage across the capacitor continues to rise (or fall) in the same direction by the amount $$\Delta V_s = \frac{IT_d}{C} \tag{3}$$

so that the effective amplitude of the capacitor voltage swing becomes $2V_{S, eff}$, where $$V_{s,eff}(I) = V_s + \frac{\Delta V_s}{2} = V_s + \frac{IT_d}{2C} \tag{4}$$

and, as a result, the frequency of oscillation drops to $$f = \frac{I}{8CV_{s,eff}(I)} = \frac{1}{\frac{8CV_s}{I} + 4T_d} \tag{5}$$

Figure 2:
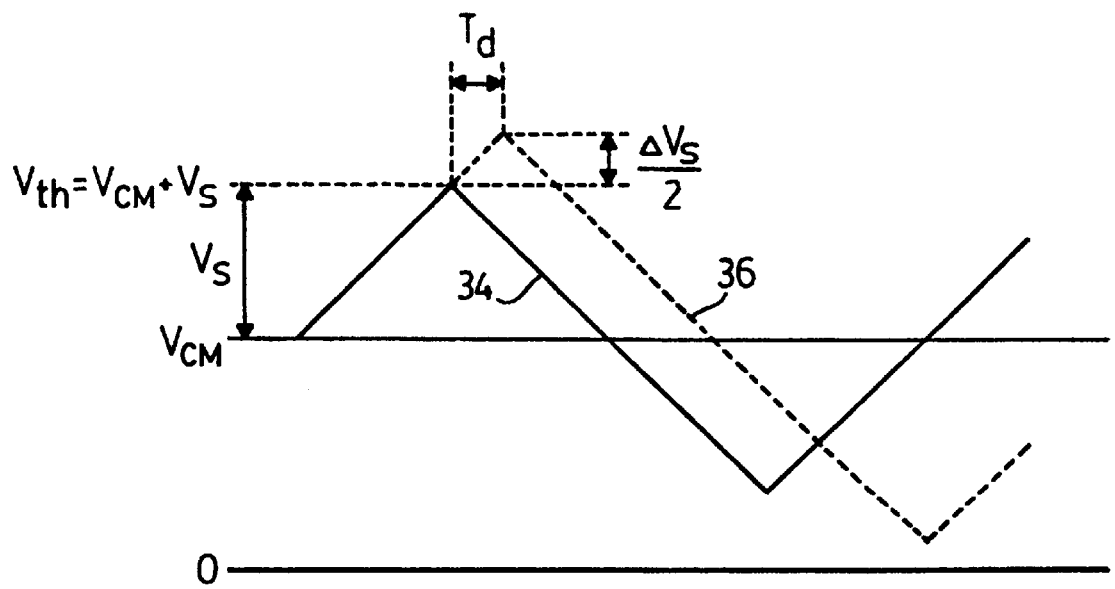
FIG. 2 shows the capacitor voltage waveform for the oscillator of FIG. 1.

The reduction in frequency due to the time delay $T_d$ is also illustrated graphically in FIG. 2 by capacitor voltage waveform 36.

As a result of the delay $T_d$, the frequency as expressed in equation (5) is no longer a linear function of the current, as the voltage swing is limited to $\pm 2V_{S, eff}$ and not $\pm 2V_S$. Also, as I is increased, the frequency slowly approaches its maximum limit $f_{max}=1/(4T_d)$. Operation of the circuit of FIG. 1 at or near $f_{max}$ is impossible in practice because it requires too much current in addition to an unreasonably large voltage swing handling capability. In addition, because $T_d$ is dependent on both temperature and process, the oscillator 10 is overly sensitive to these effects.

In the present invention, the peak value of the capacitor voltage swing is extracted and employed in a feedback loop which dynamically alters $V_{th}$ (i.e. the level of $V_{C1}$ or $V_{C2}$ at which the polarity of the charging/discharging current across the capacitor is reversed) to keep $V_{S, eff}$ constant and equal to a reference swing amplitude voltage $V_{S, ref}$. As a result, the I–f characteristic becomes linear and operation at or near the maximum frequency of oscillation $f_{max}$ becomes practically achievable when the feedback loop forces $V_S$ to zero (or equivalently $V_{th}$ to equal $V_{CM}$). FIG. 3A shows an example of how the automatic swing control (ASC) feedback linearizes the I–f characteristic of the oscillator of FIG. 1, with $T_d=300$ ps and C=1 pF arbitrarily chosen. In FIG. 3A, the I–f characteristic without ASC feedback is shown at 38 and the I–f characteristic with ASC feedback is shown at 38'. FIG. 3B illustrates how the automatic swing control (ASC) feedback maintains the capacitor voltage swing of the oscillator of FIG. 1 constant, for those same arbitrary values. In FIG. 3B, the current-voltage swing characteristic without ASC feedback is shown at 39 and the current-voltage swing characteristic with ASC feedback is shown at 39'.

Figure 4:
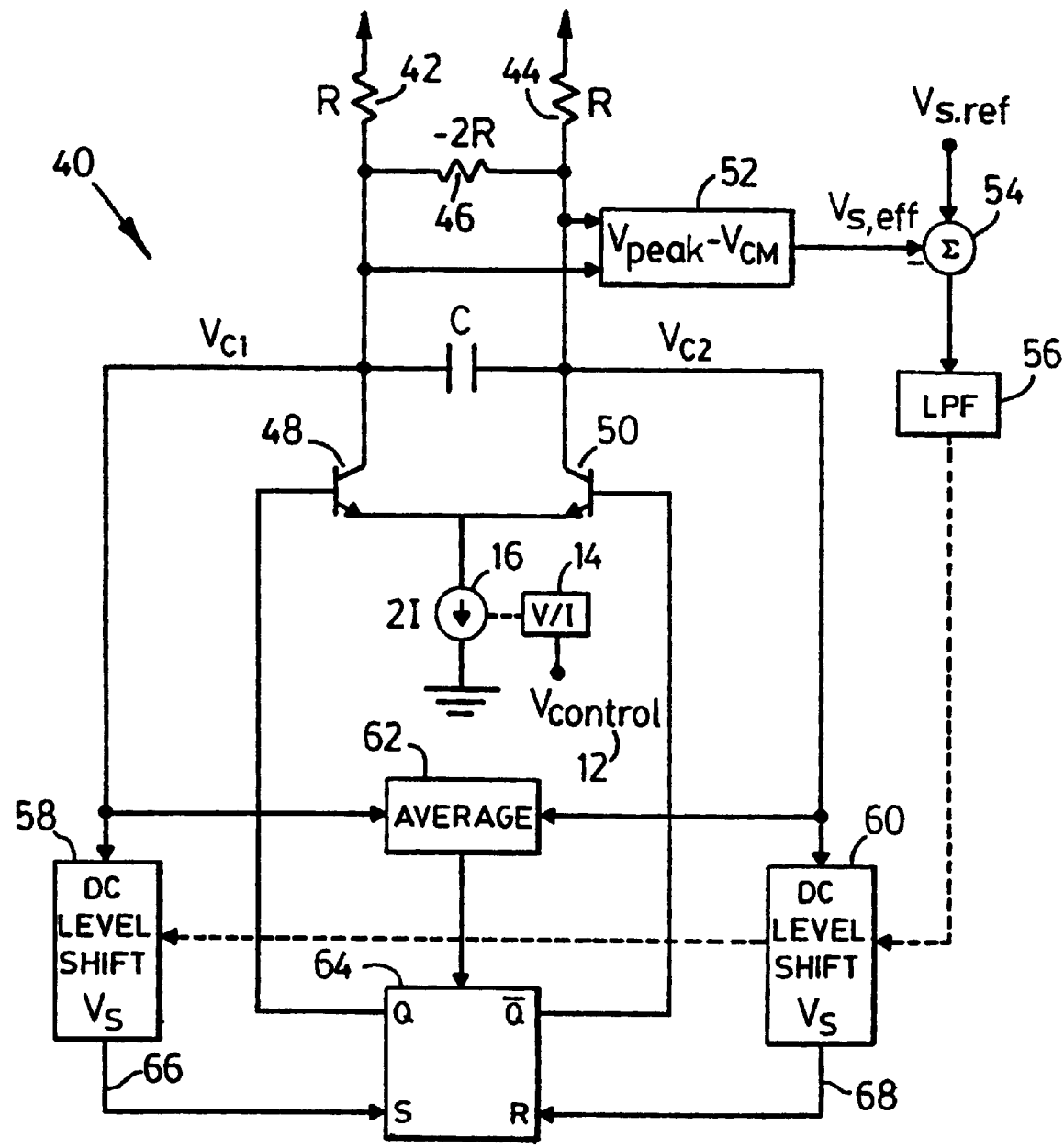
FIG. 4 is a block circuit diagram of the preferred embodiment of the present invention.

FIG. 4 shows an implementation of a relaxation oscillator 40 with ASC feedback according to a preferred embodiment of the present invention. Pull-up resistors 42 and 44 which are of equal value (denoted as R) are used instead of current supply 18 (shown in FIG. 1) which eliminates the need for high performance PNP or PMOS current sources. This implementation is advantageous since it obviates the need for a CMFB circuit to control the amount of current sourced as well as the need to use complementary transistor devices to generate charging/discharging currents of equal magnitude and opposite polarity. The negative resistance 46, which is twice the magnitude of the pull-up resistors 42 and 44, compensates for current variations across resistors 42 and 44 due to changes in voltage across them. As is well understood in the art, a negative resistance can be obtained from a device in which an increase in the applied voltage increases the resistance and thereby produces a proportional decrease in current (examples include tunnel diodes and silicon unijunction transistors). This implementation is equivalent to having an infinite time-constant in the RC network, and as a result, the capacitor C is charged and discharged with a current of constant magnitude I, such that $$I = \frac{V_{CC} - V_{CM}}{R} \tag{6}$$

where Vcc is the reference voltage connected to resistors 42 and 44 and R is the value of the resistance across resistor 42 and resistor 44. As indicated by Equation (6), the common-mode voltage $V_{CM}$ decreases linearly with the magnitude of the charging/discharging current I (and therefore also with the frequency of oscillation $f$). This is in contrast to the prior art circuit of FIG. 1 where the value of $V_{CM}$ remains constant and is independent of the magnitude of the charging/discharging current I.

Referring still to FIG. 4, the effective amplitude of the voltage swing $V_{S, \textit{eff}}$ is extracted in circuit 52 by subtracting the average value of the $V_{C1}$ and $V_{C2}$ voltage signals from the peak value of the $V_{C1}$ and $V_{C2}$ voltage signals. Alternatively, the oscillator 40 could be configured to extract some other characteristic value, such as the root-mean-square (RMS) value, from the $V_{C1}$ and $V_{C2}$ voltage signals which also enables the determination of a value proportional to the voltage swing $V_{S, \textit{eff}}$. In FIG. 4, circuit block 52 comprises RC-averaging and peak detector circuitry, both of which are well known in the art. The difference signal, $V_{S, \textit{eff}}$, output by circuit 52 is compared at 54 with reference voltage $V_{S, \textit{ref}}$. The error or difference outputted by comparator 54 is amplified and filtered by low pass filter 56 before being fed to DC level shifting circuits 58 and 60 which adjust or shift the DC level of the signals 66 and 68 respectively. The ASC feedback loop provides the necessary DC level shift adjustment to provide a constant voltage swing across capacitor C which is independent of the magnitude of the current. By adjusting the DC level shift $V_S$ in this manner and by having a sufficiently large DC gain in the ASC feedback loop, $V_{S, \textit{eff}}$ is forced to equal the constant reference $V_{S, \textit{ref}}$, and the frequency becomes a linear function of the current $$f = \frac{I}{8CV_{s,ref}}, f \leq f_{max} = \frac{1}{4T_d} \tag{7}$$

The average or common-mode voltage of the capacitor terminals ($V_{CM}=(V_{C1}+V_{C2})/2$) serves as the threshold voltage for the SR latch 64. Signals 66 and 68, which are respectively the capacitor C terminal voltages $V_{C1}$ and $V_{C2}$ DC level shifted downward by $V_S$, are used to set and reset the latch 64. The Q and $\overline{Q}$ outputs of latch 64 control the state of switching transistors 48 and 50 respectively (which form a differential pair) and therefore the direction of the charging/discharging current through capacitor C. As in FIG. 1, the charging/discharging current and therefore the frequency of oscillation may be controlled by a control voltage or current signal, as illustrated in FIG. 4 by the $V_{control}$ signal 12 and the voltage to current (V/I) converter 14. Note that if the differential oscillator output is taken between the base terminal of transistor 48 and the base terminal of transistor 50 (or alternatively between one of these base terminals and a reference terminal, such as ground), the output waveform will be a square wave, as opposed to the triangular capacitor voltage waveform shown in FIG. 2.

In an alternate embodiment of the present invention (not shown), the $V_{C1}$ and $V_{C2}$ voltage signals may be used to set and reset the SR latch, where the threshold voltage of the latch is the average or common-mode voltage of the capacitor voltage terminals $V_{CM}$ shifted upward by the DC shift value $V_S$.

As already indicated, operation of the oscillator of the present invention at or near the maximum frequency of oscillation $f_{max}$ becomes practically achievable as the feedback loop forces $V_S$ to zero. When this occurs, the voltage swing $V_{S, \textit{eff}}$ is equal to the voltage developed during the charging of the capacitor C over the period $T_d$. Since $V_{S, \textit{eff}}$ is forced to equal the reference $V_{S, \textit{ref}}$ this implies that $V_{S, \textit{ref}}$ should equal the value of $\Delta V_S$ at the maximum frequency of operation, i.e.

$$V_{s,ref} = \Delta V_s|_{f_{max}} \tag{8}$$

Figure 5:
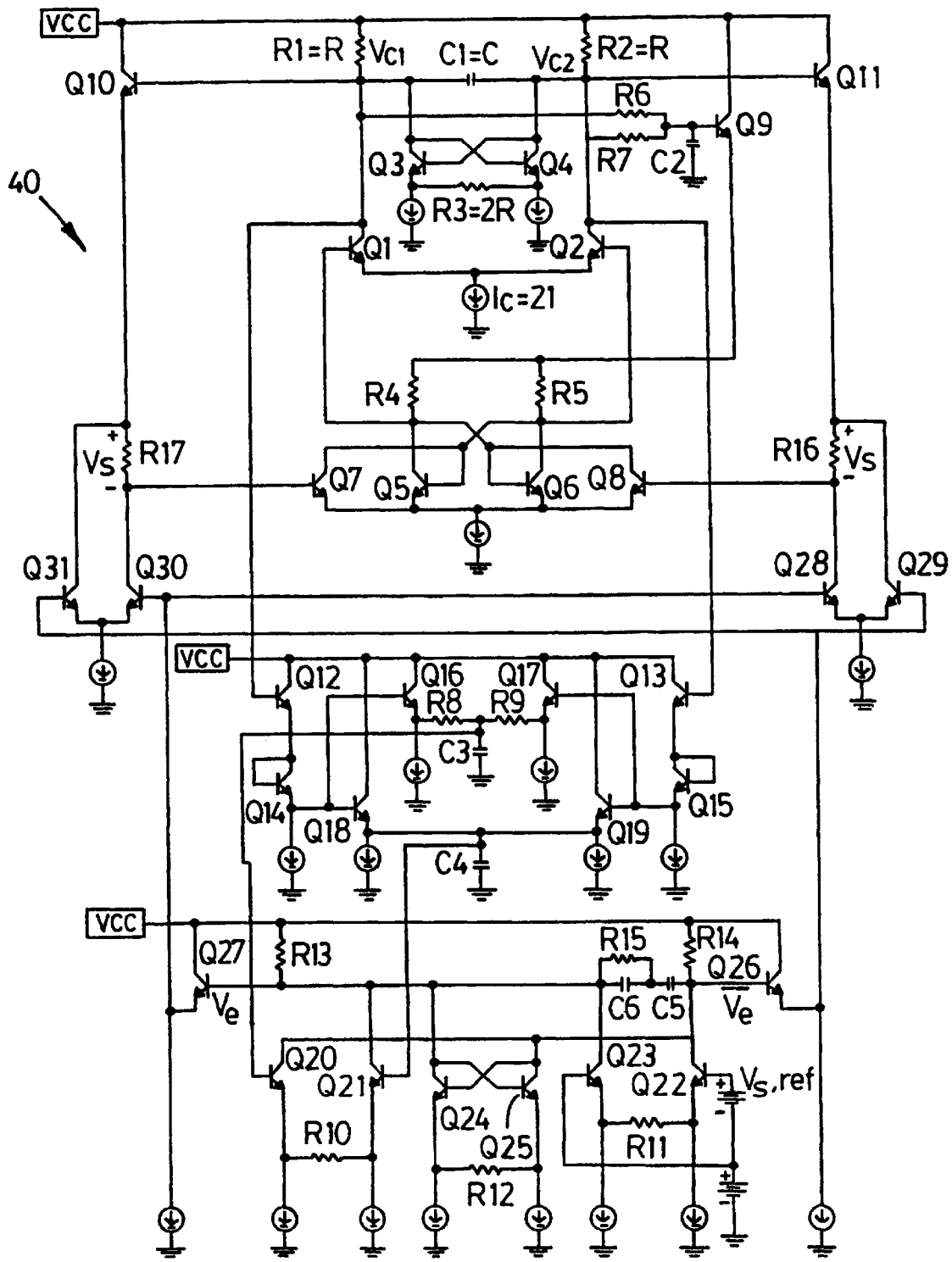
FIG. 5 is a more detailed circuit diagram for the circuit of FIG. 4.

FIG. 5 shows a detailed circuit diagram for the oscillator 40 of FIG. 4. Given the above description, the operation of the circuit of FIG. 5 is well understood by those skilled in the art and so is only described briefly here. Referring to FIG. 5, transistors $Q_3$ and $Q_4$, whose bases and collectors are cross-coupled, and resistor $R_3$ form the negative resistance 46, where resistor $R_3$ is twice the magnitude of the pull-up resistors 42 and 44 (respectively $R_1$ and $R_2$ in FIG. 5). Since transistors Q3 and Q4 are configured as voltage followers, the voltage difference from the collector of Q3 to the collector of Q4 will be approximately equal to the voltage difference from the emitter of Q4 to the emitter of Q3 (i.e. across resistor R3). A negative resistance of -2R is therefore generated between the collectors of Q3 and Q4. Alternatively, this negative resistance circuit can be improved by adding a first diode-connected transistor between the collector of Q3 and the $V_{C1}$ node and a second diode-connected transistor between the collector of Q4 and the $V_{C2}$ node. Such an improvement is described in Lee, T. H. and Bulzacchelli, J. F., "A 155-Mhz Clock Recovery Delay—and Phase-Locked Loop", *IEEE Journal of Solid-State Circuits*, Vol. 27, No. 12 (December 1992) p. 1736, which is incorporated herein by this reference.

Referring still to FIG. 5, resistors $R_6$ and $R_7$, and capacitor $C_2$ extract the average value of the capacitor C voltage signal, with transistor $Q_9$ acting as a buffer, which is then fed to the SR latch consisting of resistors $R_4$ and $R_5$ and transistors $Q_5$ and $Q_6$, $Q_7$, and $Q_8$. Transistors $Q_7$ and $Q_8$ toggle (i.e. set and reset) the state of the SR latch. The peak value of the capacitor C voltage is extracted by transistors $Q_{18}$ and $Q_{19}$ and capacitor $C_4$. The common mode voltage of the capacitor terminals is extracted by transistors $Q_{16}$ and $Q_{17}$, resistors $R_8$ and $R_9$, and capacitor $C_3$. Note that while the average and common-mode values of the capacitor C voltage are theoretically equivalent, the circuit of FIG. 5 comprises separate circuitry for extracting these signals since the average detecting circuitry must include a buffer and the circuit for extracting the common mode voltage must be compatible with the peak detection circuitry (i.e. transistors $Q_{16}$ and $Q_{17}$ should match transistors $Q_{18}$ and $Q_{19}$). Transistors $Q_{20}$, $Q_{21}$, $Q_{22}$, and $Q_{23}$ and resistors $R_{10}$, $R_{11}$, $R_{13}$, and $R_{14}$ subtract the extracted or effective swing voltage from $V_{S, \textit{ref}}$ and amplify the resulting error signal. Transistors $Q_{24}$ and $Q_{25}$ and resistor $R_{12}$ are in a positive feedback configuration which enhances the voltage gain of the error amplification. The value of $R_{12}$ is chosen so that the gain enhancement does not introduce hysteresis to the error amplifier transfer characteristic. Capacitors $C_5$ and $C_6$ and resistor $R_{15}$ comprise a low pass filter and determine the dynamic behaviour of the feedback loop including its settling time. After the ASC loop has settled, the final value of the error signal, $V_e - \overline{V}_e$, determines the portion of the tail current sources of transistor pairs $Q_{28}-Q_{29}$ and $Q_{30}-Q_{31}$ which are required to develop $V_S$, the DC voltage drop across each of resistors $R_{16}$ and $R_{17}$.

Figure 6A:
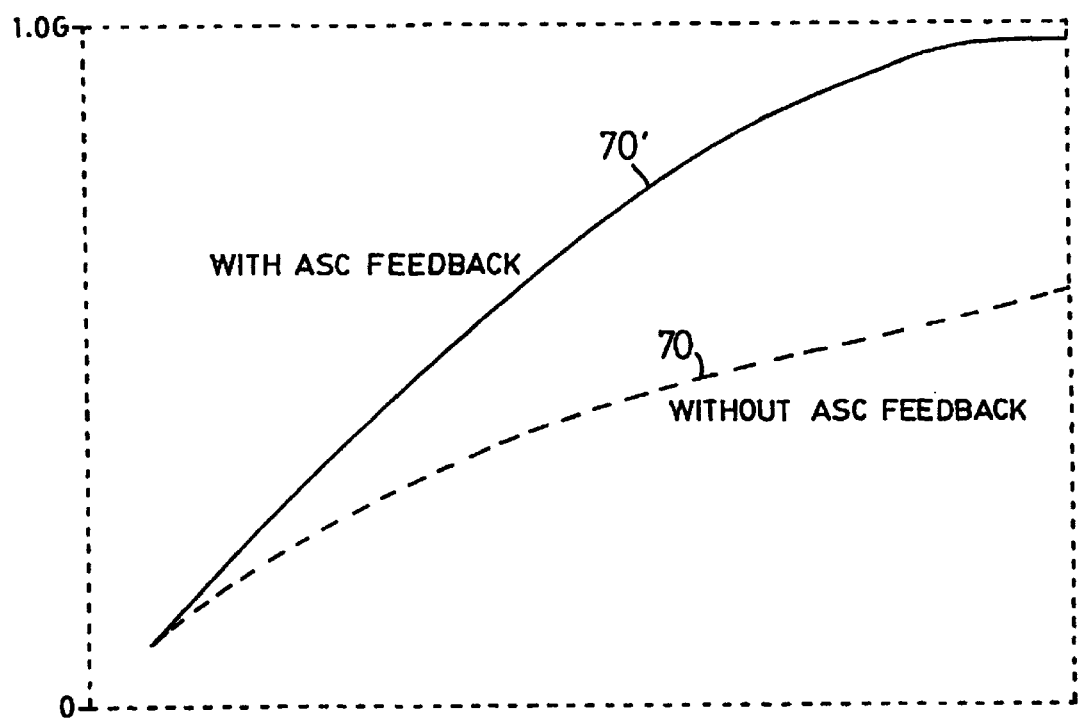
FIG. 6A is a simulation result of how the ASC feedback of the present invention linearizes the current-frequency characteristic of the oscillator of FIG. 5.
Figure 6B:
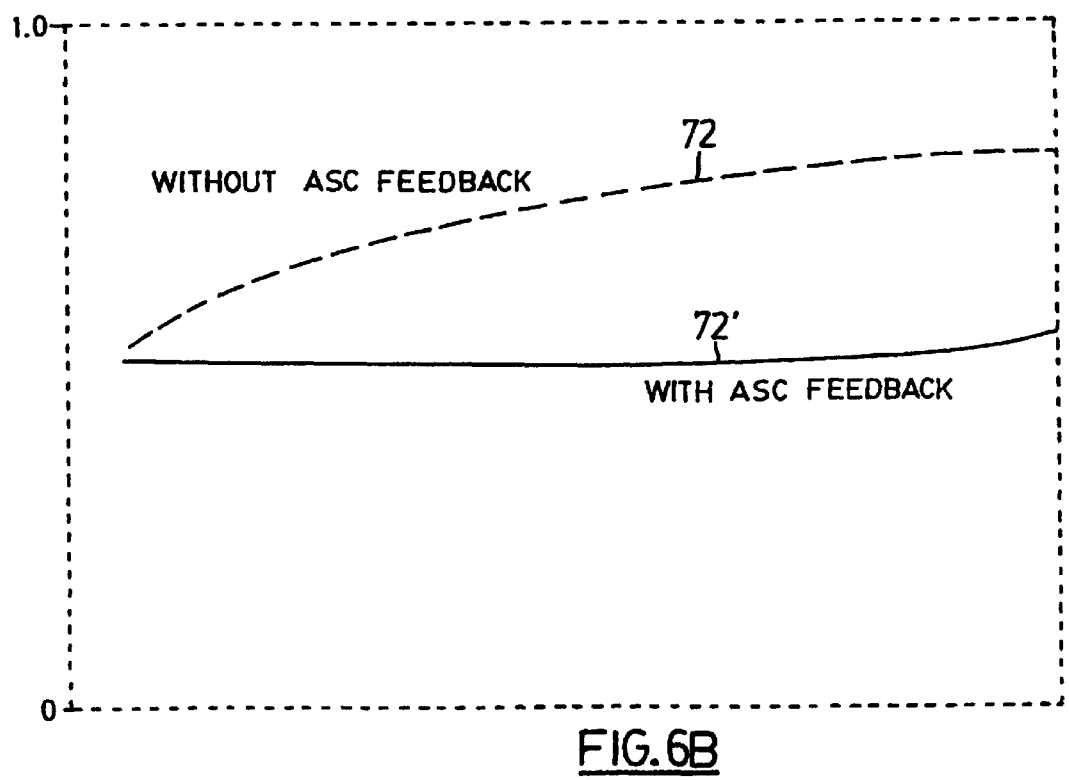
FIG. 6B is a simulation result of how the ASC feedback of the present invention maintains the capacitor voltage swing of the oscillator of FIG. 5 constant.

The circuit of FIG. 5 can be designed to have a frequency sweep range from the order of 10 MHz up to 1 GHz, with the upper frequency limit dictated by the value of $T_d$, equal to approximately 250 ps. FIG. 6A shows a SPICE simulation of the circuit of FIG. 5 illustrating how the automatic swing control (ASC) feedback linearizes the I–f characteristic in comparison to the same circuit (designed so that it oscillates at 100 MHz with the equivalent charging current and voltage swing) with the ASC feedback loop disabled. In FIG. 6A, the simulated I–f characteristic without is ASC feedback is shown at 70 and the simulated I–f characteristic with ASC feedback is shown at 70'. FIG. 6B shows a SPICE simulation of the circuit of FIG. 5 illustrating how the ASC feedback maintains the capacitor voltage swing constant, again in comparison to the same circuit with the ASC feedback loop disabled. In FIG. 6B, the current-voltage swing characteristic without ASC feedback is shown at 72 and the current-voltage swing characteristic with ASC feedback is shown at 72'. As can be seen from FIGS. 6A and 6B, the ASC loop successfully regulates the amplitude of oscillations over virtually the entire frequency range of operation. As a result of this regulation, the frequency drop observed for the conventional oscillator has been greatly overcome. In addition, because the negative effect of $T_d$ on the oscillator is reduced in the present invention, the oscillator also becomes less sensitive to the effects of temperature and process (since $T_d$ is dependent on both of these).

It should be clear that the present invention is in no way limited to collector-coupled oscillators and can also be applied to other types of relaxation oscillators in which the switching or toggling delay (i.e. the delay between the capacitor voltage reaching a threshold level and the reversal of the polarity of the current through the capacitor) causes undesirable increases in the capacitor voltage and decreases in the frequency of oscillation.

While preferred embodiments of the present invention have been described, the embodiments disclosed are illustrative and not restrictive, and the scope of the invention is intended to be defined only by the breadth and spirit of the appended claims.

We claim:

1. An oscillator circuit for generating an oscillating signal of a certain frequency, said oscillator circuit comprising:
   (a) a capacitance coupled between a first terminal and a second terminal and adapted to have a voltage swing thereacross;
   (b) a current supply circuit coupled to said capacitance for providing a current through said capacitance, the magnitude of said current being proportional to said frequency and the polarity of said current being reversible;
   (c) a switching circuit coupled to said current supply circuit and responsive to one or more control signals, for controlling the polarity of said current through said capacitance;
   (d) a DC shift providing circuit coupled to said capacitance for providing a DC shift value in response to the voltage at said first terminal, the voltage at said second terminal, and a predetermined value; and
   (e) a control circuit coupled to said capacitance and said DC shift providing circuit for generating said one or more control signals in response to said voltage at said first terminal, said voltage at said second terminal, and said DC shift value so as to maintain the voltage swing across said capacitance substantially constant.

2. An oscillator circuit according to claim 1, wherein said DC shift providing circuit comprises:

(a) an extraction circuit for determining a value proportional to the voltage swing across said capacitance;
   (b) a first difference circuit for determining the difference between said value proportional to said voltage swing and said predetermined value to provide an error signal; and
   (c) an amplification and filtration circuit for amplifying and filtering said error signal to provide said DC shift value.

3. An oscillator circuit according to claim 2, wherein said extraction circuit for determining a value proportional to said voltage swing across said capacitance comprises:
   (a) a peak detection circuit for extracting the peak value of the voltage at said first terminal and the voltage at said second terminal;
   (b) an average detection circuit for extracting the average value of the voltage at said first terminal and the voltage at said second terminal to produce an average value; and
   (c) a second difference circuit for determining the difference between said peak value and said average value to provide the amplitude of said voltage swing.

4. An oscillator circuit according to claim 1 wherein said control circuit comprises:
   (a) a level shifting circuit for producing a first signal and a second signal said first signal being equal to the voltage at said first terminal shifted by said DC shift value and said second signal being equal to the voltage at said second terminal shifted by said DC shift value;
   (b) an average detection circuit for extracting the average value of the voltage at said first terminal and the voltage at said second terminal to produce an average value signal; and
   (c) an SR (set-reset) latch circuit having a set input, a reset input, and a threshold input, wherein said first signal is coupled to said set input, said second signal is coupled to said reset input, and said average value signal is coupled to said threshold input, said SR latch circuit producing a first control signal and a second control signal, said first control signal being complementary to said second control signal.

5. An oscillator circuit according to claim 1 wherein said control circuit comprises:
   (a) an average detection circuit for extracting the average value of the voltage at said first terminal and the voltage at said second terminal to produce an average value signal; and
   (b) a level shifting circuit for producing a shifted average value signal, said shifted average value signal being equal to said average value signal shifted by said DC shift value;
   (c) an SR (set-reset) latch circuit having a set input, a reset input, and a threshold input, wherein the voltage at said first terminal is coupled to said set input, said voltage at said second terminal is coupled to said reset input, and said shifted average value signal is coupled to said threshold input, said SR latch circuit producing a first control signal and a second control signal, said first control signal being complementary to said second control signal.

6. An oscillator circuit according to claim 1 wherein said switching circuit comprises a first switch and a second switch.

7. An oscillator circuit according to claim 1 wherein said switching circuit comprises a first transistor and a second transistor forming a differential pair.

8. An oscillator circuit according to claim 4 wherein said switching circuit comprises
   a first transistor having a collector coupled to said first terminal, an emitter coupled to a common emitter terminal, and a base for receiving said first control signal; and
   a second transistor having a collector coupled to said second terminal, an emitter coupled to said common emitter terminal, and a base for receiving said second control signal.

9. An oscillator circuit according to claim 8 wherein said current supply circuit comprises:
   (a) a first current supply for generating a first current into said first terminal and a second current into said second terminal, said first current being equal in magnitude to said second current; and
   (b) a second current supply for generating a third current out of said common emitter terminal,
   so that the sum of the magnitude of said first current and the magnitude of said second current is equal to the magnitude of said third current.

10. An oscillator circuit according to claim 9 wherein said first current supply comprises:
    (a) a DC power supply;
    (b) a first resistance coupled between said DC power supply and said first terminal;
    (c) a second resistance coupled between said DC power supply and said second terminal, the resistance across said second resistance being equal to the resistance across said first resistance; and
    (d) a negative resistance coupled between said first terminal and said second terminal, the magnitude of the resistance across said negative resistance being equal to the sum of the magnitude of said first resistance and the magnitude of said second resistance.

11. An oscillator circuit according to claim 1 wherein said current supply circuit is coupled to a frequency control signal operative to adjust the magnitude of said current through said capacitance.

12. An oscillator circuit according to claim 9 wherein said second current supply is coupled to a frequency control signal operative to adjust the magnitude of said third current.

13. An oscillator circuit according to claim 1 wherein said oscillating signal is the difference between the voltage at said first terminal and the voltage at said second terminal.

14. An oscillator circuit according to claim 4 wherein said oscillating signal is the difference between said first control signal and said second control signal.

15. A method for generating an oscillating signal of a certain frequency, said method comprising the steps of:
    (a) providing a current through a capacitance, said capacitance being coupled between a first terminal and a second terminal and said capacitance being adapted to have a voltage swing thereacross, the magnitude of said current being proportional to said frequency and the polarity of said current being reversible;
    (b) establishing the polarity of said current through said capacitance in response to one or more control signals;
    (c) generating a DC shift value in response to the voltage at said first terminal, the voltage at said second terminal, and a predetermined value; and
    (d) generating said one or more control signals in response to said voltage at said first terminal, said voltage at said second terminal, and said DC shift value so as to maintain the voltage swing across said capacitance substantially constant.

16. A method for generating an oscillating signal according to claim 15, wherein step (c) further comprises the steps of:
    (a) extracting a value proportional to the effective voltage swing across said capacitance;
    (b) determining the difference between said value proportional to said effective voltage swing and said predetermined value to provide an error signal; and
    (c) amplifying and filtering said error signal to provide said DC shift value.

17. A method for generating an oscillating signal according to claim 16, wherein step (a) further comprises the steps of:
    (a) extracting the peak value of the voltage at said first terminal and the voltage at said second terminal;
    (b) extracting the average value of the voltage at said first terminal and the voltage at said second terminal; and
    (c) determining the difference between said peak value and said average value to provide the amplitude of said effective voltage swing.

18. A method for generating an oscillating signal according to claim 15, wherein step (d) further comprises the steps of:
    (a) shifting the DC level of the voltage at said first terminal by said DC shift value to provide a first signal;
    (b) shifting the DC level of the voltage at said second terminal by said DC shift value to provide a second signal;
    (c) extracting the average value of the voltage at said first terminal and the voltage at said second terminal to produce an average value signal; and
    (d) producing a first control signal and a second control signal in response to said first signal, said second signal, and said average value signal, said first control signal being complementary to said second control signal, such that when said first signal is greater than said average value signal said first control signal is at a first level and said second control signal is at a second level, and when said second signal is greater than said average value signal said first control signal is at said second level and said second control signal is at said first level.

19. A method for generating an oscillating signal according to claim 15, wherein step (d) further comprises the steps of:
    (a) extracting the average value of the voltage at said first terminal and the voltage at said second terminal to produce an average value signal; and
    (b) shifting the DC level of said average value signal by said DC shift value to provide a shifted average value signal;
    (c) producing a first control signal and a second control signal in response to the voltage at said first terminal, the voltage at said second terminal, and said shifted average value signal, said first control signal being complementary to said second control signal, such that when the voltage at said first terminal is greater than said shifted average value signal said first control signal is at a first level and said second control signal is at a second level, and when the voltage at said second terminal is greater than said shifted average value signal said first control signal is at said second level and said second control signal is at said first level.

20. An oscillator circuit for generating an oscillating signal of a certain frequency, said oscillator circuit comprising:

(a) a capacitance coupled between a first terminal and a second terminal;
(b) a current supply circuit for providing a current through said capacitance, the polarity of said current being reversible, said current supply circuit comprising
   a DC power supply,
   a first resistance coupled between said DC power supply and said first terminal,
   a second resistance coupled between said DC power supply and said second terminal, the resistance across said second resistance being equal to the resistance across said first resistance,
   a negative resistance coupled between said first terminal and said second terminal, the magnitude of the resistance across said negative resistance being equal to the sum of the magnitude of said first resistance and the magnitude of said second resistance, and
   a current source for generating a sink current out of a third terminal, the magnitude of said sink current being proportional to said frequency; and
(c) a control switching circuit coupled to said current supply circuit for controlling the polarity of said current through said capacitance by alternately coupling either said first terminal to said third terminal or said second terminal to said third terminal.

21. An oscillator circuit according to claim 20 wherein said negative resistance comprises:
   a first transistor having a collector coupled to said first terminal, an emitter, and a base;
   a second transistor having a collector coupled to said second terminal, an emitter, and a base, the collector of said second transistor being coupled to the base of said first transistor and the base of said second transistor being coupled to the collector of said first transistor;
   a resistance circuit, coupled between said emitter of said first transistor and said emitter of said second transistor, the magnitude of the resistance between said emitter of said first transistor and said emitter of said second transistor being equal to the sum of the magnitude of said first resistance and the magnitude of said second resistance.

22. An oscillator circuit according to claim 20 wherein said current source is coupled to a frequency control signal operative to adjust the magnitude of said sink current.

\* \* \* \* \*